United States Patent
Liaw

(10) Patent No.: US 7,307,871 B2
(45) Date of Patent: Dec. 11, 2007

(54) SRAM CELL DESIGN WITH HIGH RESISTOR CMOS GATE STRUCTURE FOR SOFT ERROR RATE IMPROVEMENT

(75) Inventor: Jhon-Jhy Liaw, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/287,449

(22) Filed: Nov. 22, 2005

(65) Prior Publication Data
US 2006/0120143 A1    Jun. 8, 2006

Related U.S. Application Data

(62) Division of application No. 10/460,983, filed on Jun. 13, 2003, now Pat. No. 6,992,916.

(51) Int. Cl.
| | |
|---|---|
| C11C 11/00 | (2006.01) |
| C11C 5/06 | (2006.01) |
| H01L 23/62 | (2006.01) |
| H01L 29/00 | (2006.01) |
| H01L 2/8238 | (2006.01) |
| H01L 21/44 | (2006.01) |
| H01L 21/4763 | (2006.01) |

(52) U.S. Cl. ............... 365/154; 365/63; 365/72; 365/188; 257/388; 257/413; 257/536; 257/538; 257/E27.098; 257/E29.156; 257/E29.161; 438/210; 438/649; 438/682

(58) Field of Classification Search ............ 257/377, 257/384, 413, 754, 755; 365/154, 148, 63, 365/72, 181
See application file for complete search history.

(56) References Cited

U.S. PATENT DOCUMENTS

| | | | | |
|---|---|---|---|---|
| 5,126,279 | A * | 6/1992 | Roberts | 438/210 |
| 5,135,882 | A * | 8/1992 | Karniewicz | 438/385 |
| 5,754,467 | A * | 5/1998 | Ikeda et al. | 365/154 |
| 6,180,984 | B1 * | 1/2001 | Golke et al. | 257/347 |
| 6,686,633 | B1 * | 2/2004 | Lage et al. | 257/392 |
| 6,717,233 | B1 * | 4/2004 | Haddad et al. | 257/536 |
| 6,756,692 | B2 * | 6/2004 | Hirano et al. | 257/393 |
| 2003/0006433 | A1 * | 1/2003 | Funayama et al. | 257/202 |
| 2004/0136128 | A1 * | 7/2004 | Kato | 361/56 |
| 2005/0248977 | A1 * | 11/2005 | Liaw | 365/154 |

* cited by examiner

*Primary Examiner*—Ly Duy Pham
(74) *Attorney, Agent, or Firm*—Tung & Associates

(57) ABSTRACT

A high resistor SRAM memory cell to reduce soft error rate includes a first inverter having an output as a first memory node, and a second inverter having an output as a second memory node. The second memory node is coupled to an input of the first inverter through a first resistor. The first memory node is coupled to an input of the second inverter through a second resistor. A pair of access transistors are respectively coupled to a pair of bit lines, a split word line and one of the memory nodes. The resistors are prepared by coating a layer of silicide material on a selective portion of the gate structure of the transistors included in the first inverter, and connecting a portion of the gate structure that is substantially void of the silicide material to the drain of the transistors included in the second inverter.

8 Claims, 7 Drawing Sheets

– 1 –

SRAM CELL DESIGN WITH HIGH RESISTOR CMOS GATE STRUCTURE FOR SOFT ERROR RATE IMPROVEMENT

CROSS-REFERENCE TO RELATED APPLICATION

This application is a divisional application of and claims benefit of priority from U.S. patent application Ser. No. 10/460,983, filed Jun. 13, 2003, now U.S. Pat. No. 6,992,916, entitled 'SRAM Cell Design With High Resistor CMOS Gate Structure Por Soft Error Rate Improvement', and assigned to the same assignee as the present invention.

BACKGROUND OF THE INVENTION

1. Field of the Invention

The present invention relates generally to integrated circuits and methods for memory cells and more particularly to memory cells that offer improved protection against soft errors.

2. Description of the Relevant Art

Reduced geometry integrated circuit ("IC") chip designs are being adopted to increase the density of devices within integrated circuits, thereby increasing performance and decreasing the cost of the ICs. Modern IC memory chips, such as dynamic random access memory ("DRAM"), static random access memory ("SRAM"), and read only memory ("ROM"), are examples of chips having increasingly higher densities and lower costs. Increases in chip density are primarily accomplished by forming smaller structures within devices and by reducing the separation between devices or between the structures that make up the devices. Typically higher density memory chips often operate under lower voltage levels.

Reduced, sub-micron level geometries and reduced operating voltages deployed in these chips make them vulnerable to particle induced soft errors. Typically, soft errors occur when charged particles penetrate a memory cell and cross a junction, creating an abnormal charge that undesirably causes the state of the memory cell to change. Among the common sources of soft errors are alpha particles emitted by contaminants in memory chip packages and/or cosmic rays penetrating the earth's atmosphere. A soft error is typically not caused as a result of any permanent physical defect in the memory cell, and may be fixed by simply writing new data to the invalid memory cell. Occurrences of soft errors typically reduce the reliability of the memory cell.

Functionality and fabrication method of a memory cell such as a conventional SRAM is well known. Traditional techniques to reduce the soft error occurrence in the memory cell have focused on increasing the capacitance of the charge storage node(s) of the cell, where charge Q=C*V. For example, U.S. Pat. No. 5,886,375 entitled 'SRAM having improved soft-error immunity' discloses one such technique. However, these techniques often result in increasing the substrate surface area, and/or introducing additional substrate layers. This adds to the complexity of fabricating the chip and raises its cost.

Thus, a need exists to provide a memory cell that offers improved protection against soft errors. Additionally, it would be desirable for the improved memory cell to be cost effective, and be accommodated in the same substrate area and/or layer structure as a traditional memory cell.

SUMMARY OF THE INVENTION

The problems outlined above are addressed in a large part by an apparatus and method for reducing soft errors of a SRAM memory cell, as described herein. According to one form of the invention, a high resistor SRAM memory cell to reduce soft error rate includes a first inverter having an output as a first memory node, and a second inverter having an output as a second memory node. The second memory node is coupled to an input of the first inverter through a first resistor. The first memory node is coupled to an input of the second inverter through a second resistor. A pair of access transistors are respectively coupled to a pair of bit lines, a split word line and one of the memory nodes. The resistors are prepared by coating a layer of silicide material on a selective portion of the gate structure of the transistors included in the first inverter, and connecting a portion of the gate structure that is substantially void of the silicide material to the drain of the transistors included in the second inverter.

According to another aspect of the invention, the method for fabricating a first high resistor SRAM cell includes preparing a coat of a layer of silicide material on a selective portion of a first gate structure of transistors included in the first inverter of the SRAM cell. A portion of the first gate structure that is substantially void of the silicide material is connected to the drains of the transistors included in the second inverter. A similar method may be used to fabricate the second resistor.

Other forms, as well as objects and advantages of the invention will become apparent upon reading the following detailed description and upon reference to the accompanying drawings.

BRIEF DESCRIPTION OF THE DRAWINGS

Novel features believed characteristic of the invention are set forth in the appended claims. The invention itself, however, as well as a preferred mode of use, various objectives and advantages thereof, will best be understood by reference to the following detailed description of an illustrative embodiment when read in conjunction with the accompanying drawings, wherein:

DETAILED DESCRIPTION OF AN EMBODIMENT

Figure 1:
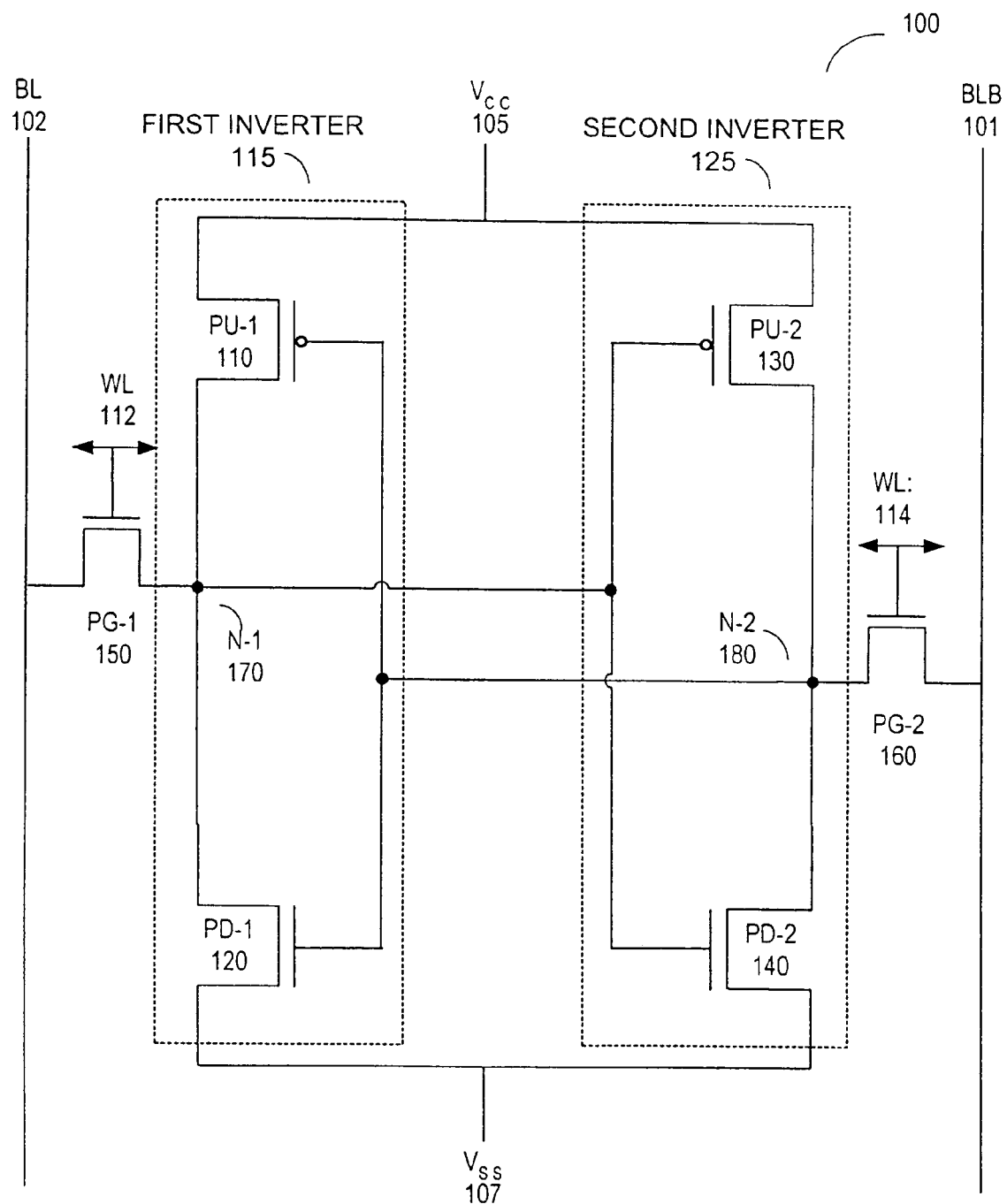
FIG. 1 is an illustrative circuit diagram of memory cell of a conventional CMOS type SRAM.

While the invention is susceptible to various modifications and alternative forms, specific embodiments thereof are shown by way of example in the drawings and will be described herein in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Elements, which appear in more than one figure herein, are numbered alike in the various figures. The present invention describes an apparatus and method to reduce soft error rate of a SRAM memory cell. According to one form of the invention, a non-silicide poly-1 region is prepared on CMOS gate portion of the SRAM to create a high resistor. The high resistor advantageously causes a delay in depleting charges stored on the memory nodes of the cell when a disturbance such as alpha particles is received, thereby reducing soft errors.

SRAM cells are generally used in memory applications that require high-speed processing such as cache. The traditional SRAM cell design includes two types of architectures. A high-resistance load type memory cell and a CMOS type memory cell. The high-resistance load type cell is constructed of four transistors ("4T") and two high-resistance elements. The CMOS type cell is typically constructed of six transistors ("6T") Due to the very small leakage current during data holding, the CMOS type SRAM cell design has high reliability and is widely used at the present. Other well-known types of SRAM cell designs include one-transistor type and three-transistor type that provide additional savings in size and power.

FIG. 1 is an illustrative circuit diagram of memory cell 100 of a conventional CMOS type SRAM. As is well known, a pair of cross-coupled inverters forms a memory cell. A first MOS transistor PU-1 110 of a first conductive type, e.g., PMOS transistor (load transistor) and a second MOS transistor PD-1 120 of a second conductive type, e.g., NMOS transistor (drive transistor) compose a first inverter 115. A third MOS transistor PU-2 130 of the first conductive kind, e.g., PMOS transistor (load transistor) and a fourth MOS transistor PD-2 140 of the second conductive kind, e.g., a NMOS transistor (drive transistor) compose a second inverter 125. The output of the first inverter 115 is connected to the input of the second inverter 125, i.e. are cross-coupled. As is well known, the MOS transistors may be fabricated using CMOS technology that makes use of both P and N channel devices in the same substrate material.

The logic state can be written and read at a first memory node N-1 170 which is the output point of the first inverter 115 and also the input point of the second inverter 125, and a second memory node N-2 180 which is the output point of the second inverter 125 and also the input point of the first inverter 115. If node N-2 180 is higher than the switching threshold of the second inverter 125 then PD-1 120 pulls down node N-1 170. This in turn causes PU-2 130 to pull node N-2 higher 180. This positive feedback action forces memory node N-2 180 to a high state, e.g., $V_{CC}$ 105 and memory node N-1 170 to a low state, e.g., $V_{SS}$ 107. Thus the memory cell 100 stores a value of one when memory node N-2 180 is high and N-1 170 is low. Similarly, if the cell stores a zero then node N-2 180 is low and N-1 170 is high.

The stored value in the memory cell 100 may be altered and read through NMOS access transistors PG-1 150 and PG-2 160. The NMOS transistor PG-2 160 has its gate connected to a split word line WL: 114, the source connected to the N-2 180, and the drain connected to a positive phase bit line BL 102. The NMOS transistor PG-1 150 has its gate connected to a word line WL 112, the source connected to N-1, and the drain connected to a negative phase bit line BLB 101. Thus, by selection of word line WL, positive phase bit line BL, and negative phase bit line BLB, the memory value stored in the memory node N-1 170 or N-2 180 can be read out.

As described earlier, reduced design rules in SRAM's often reduce the size of the transistor gates, thereby reducing the capacitance of the charge stored on memory nodes N-1 170 and N-2 180. By reducing the capacitance of the nodes or by reducing the voltage at which charge is stored on the nodes, traditional SRAM designs store reduced levels of charge on the nodes N-1 170 and N-2 180. Reducing the amount of charge stored on the nodes of an SRAM makes it more likely that an undesired charge generation event in the SRAM, especially in the substrate adjacent one of the storage nodes may result in a soft error. The undesired charge generation event may be caused by a disturbance, such as might be associated with alpha particles. The alpha particle generates hole-electron pairs on the well junction areas. The NMOS memory node N-1 or N-2 holding the charge for the high level may collect these electrons causing the charge to deplete. The disturbance can reduce the difference in the charge levels stored on the nodes of the SRAM memory cell 100 to an unacceptably small level, e.g., below a threshold level, and increase the likelihood that an erroneous binary data state will be detected when reading data from the SRAM memory cell.

Figure 2:
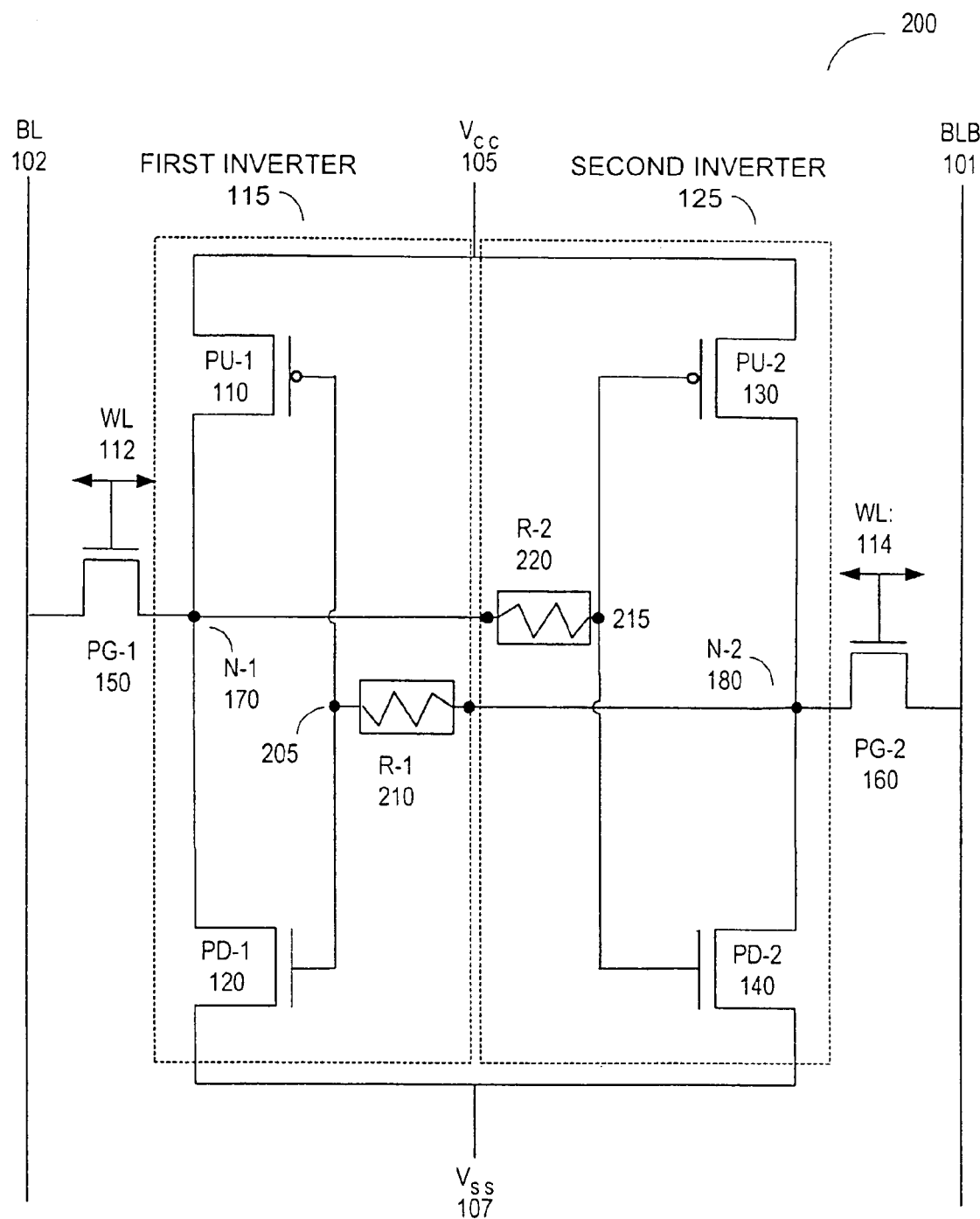
FIG. 2 is an illustrative circuit diagram of memory cell of a high-resistor CMOS type SRAM, according to an embodiment of the present invention.

FIG. 2 is an illustrative circuit diagram of memory cell of a high-resistor CMOS type SRAM 200, according to an embodiment of the present invention. A first resistor R-1 210 is placed serially between the output of the second inverter 125 and the input of the first inverter 115. Specifically, R-1 210 is placed between memory node N-2 180 and the gate structure node 205 of transistors PU-1 110 and PD-1 120. It may be recalled that memory node N-2 180 is defined by the junction of the drain of PU-2 130 and the drain of PD-2 140. Also, the input to the first inverter 115 is received by the gate structure node 205 of PU-1 110 and PD-1 120 transistors.

Similarly, a second resistor R-2 220 is placed serially between the output of the first inverter 115 and the input of the second inverter 125. Specifically, R-2 220 is placed between memory node N-1 170 and the gate structure node 215 of PU-2 130 and PD-2 140 transistors. It may be recalled that memory node N-1 170 is defined by the junction of the drain of PU-1 110 and the drain of PD-1 120. Also, the input to the second inverter 125 is received by the gate structure node 215 of PU-2 130 and PD-2 140 transistors.

The placement of R-1 210 and R-2 220 resistors in the gate structure node of the CMOS transistors advantageously causes a delay in depleting charges stored on the memory nodes N-1 170 and N-2 180 on receiving the disturbance such as alpha particles. The introduction of the delay thus advantageously provides additional time for the memory nodes to remain below the threshold level during the presence of the disturbance. The delay thus reduces the occurrence soft errors caused by the disturbance. Further detail about the discharge circuits is described in FIG. 3. Layout and fabrication techniques to prepare R-1 210 and R-2 220 resistors are described in FIGS. 4-6.

Figure 3:
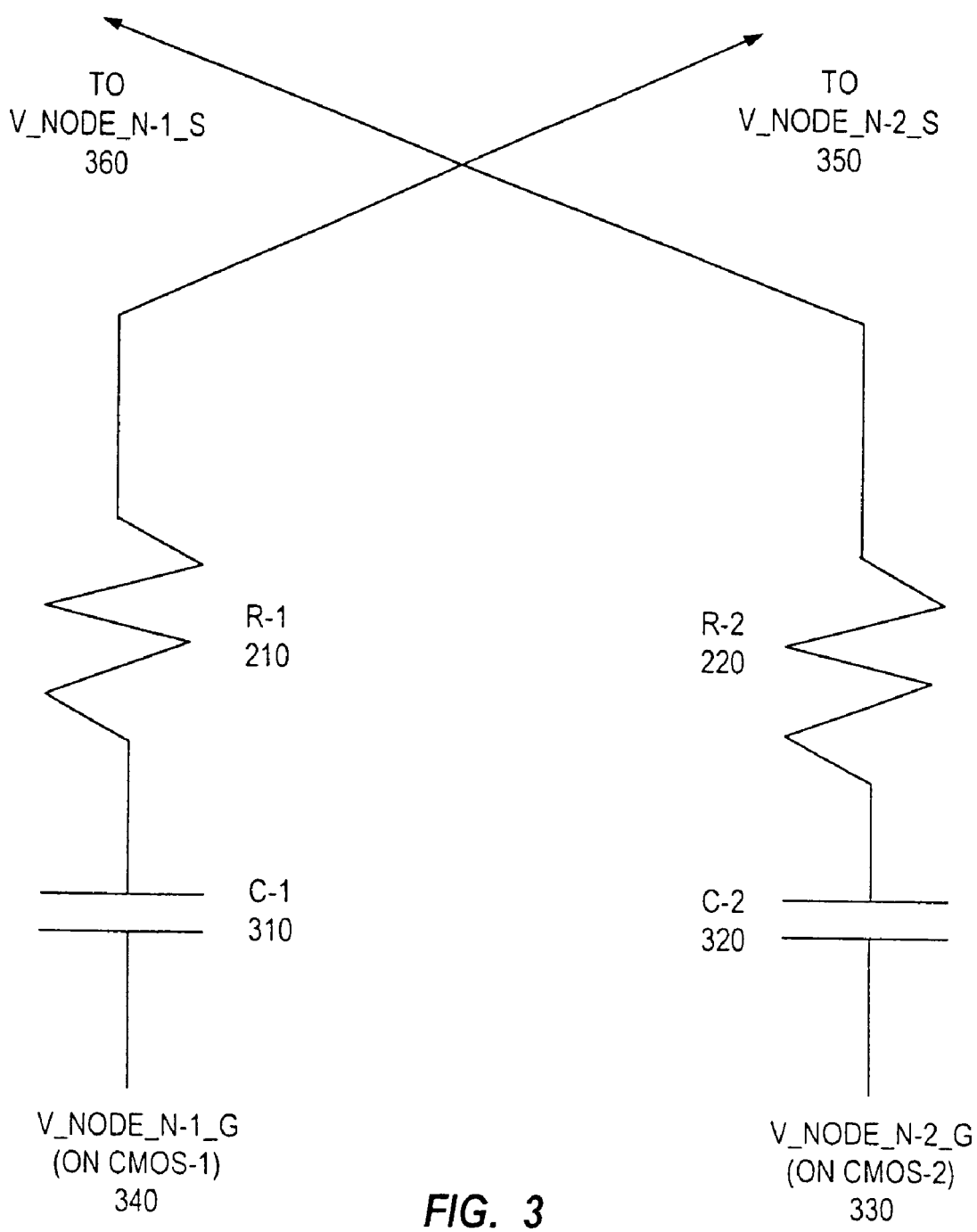
FIG. 3 is an illustrative circuit diagram of discharge paths for a high-resistor CMOS type SRAM shown in FIG. 2, according to an embodiment of the present invention.

FIG. 3 is an illustrative circuit diagram of discharge paths for a high-resistor CMOS type SRAM 200 shown in FIG. 2, according to an embodiment of the present invention. In one embodiment, the first inverter 115 may be implemented as CMOS-1 and the second inverter may be implemented as CMOS-2.

If memory node N-1 170 stores a one (high charge), then memory node N-2 180 will store a zero (low charge), and vice versa. The SRAM cell state typically corresponds to the state of the memory node N-2 180. If node N-1 170 is low, then node V_Node_N-1_S 360 and node V_Node_N-1_G 340 will stay at one (high charge state or at $V_{CC}$ 105) while node V_Node_N-2_S 350 and node V_Node_N-2_G will stay at low (low charge state or $V_{SS}$ 107). On receiving a disturbance such as alpha particles, hole-electron pairs are generated on NMOS well area. The number of electrons generated may be high enough to cause a high-level charge stored on memory node N-1 to discharge. In response to a depletion of the high level charge, node V_Node_N-1_S (on silicon CMOS-1 drain area) will become low level. So node V_Node_N-1_G will discharge through an RC delay circuit. The equation E300 for the discharge time is:

$$V = V_{CC} * e^{(-t/RC)} \qquad \text{E300}$$

or $$t = -RC * \log(V/V_{CC}) \qquad \text{E310}$$

where V is indicative of voltage at gate of MOS transistor, t is indicative of the discharge time, which is indicative of the soft error rate immunity, R is indicative of the CMOS gate resistance and C is indicative of (PMOS+NMOS gate capacitance).

The discharge paths for charges stored on memory nodes N-1 170 and N-2 180 are illustrated. Capacitance C1 310 includes gate capacitances of PU-1 110 and PD-1 120 transistors. Similarly, capacitance C2 320 includes gate capacitances of PU-2 130 and PD-2 140 transistors. The discharge path for a charge stored on node N-1 170 includes node V_Node_N-1_G 340 (on gate CMOS-1), C1 310, R-1 210 and node V_Node_N-2_S 350 (on silicon CMOS-2 drain node). Similarly, the discharge path for a charge stored on node N-2 180 includes node V_Node_N-2_G 330 (on gate CMOS-2), C2 320, R-2 220 and node V_Node_N-1 S 360 (on silicon CMOS-1 drain node).

Traditional techniques to reduce soft error rates have focused on increasing capacitance C. In a typical case the value of C is constant, depending on particular gate oxide thickness and gate structure. Hence, varying R may advantageously control the discharge time, and hence the soft error rate.

In one embodiment, selecting various poly materials may vary the resistance. For example, sheet resistance of P+ poly-1 with silicide is about 3~50 ohms/sq and P+ poly without silicide (P+ poly material that is void of silicide) is about 100~2000 ohms/sq. Sheet resistance of P_LDD only is about 50,000~100,000 ohms/sq. In one embodiment, the first and second resistors may be fabricated from poly material that is void of silicide, e.g., by creating a non-silicide P+ (high concentration of B11 or BF2) region in a CMOS gate structure. The non-silicide P+ region having a higher resistance compared to a region with silicide will allow for a longer discharge time to low level during the disturbance, thereby reducing the soft errors.

In one embodiment, non-silicide P– (medium concentration B11 or BF2) LDD only poly material may be used in the fabrication. Layout and fabrication techniques to prepare the high resistor SRAM cell 200 are described in FIGS. 4-7.

Figure 4:
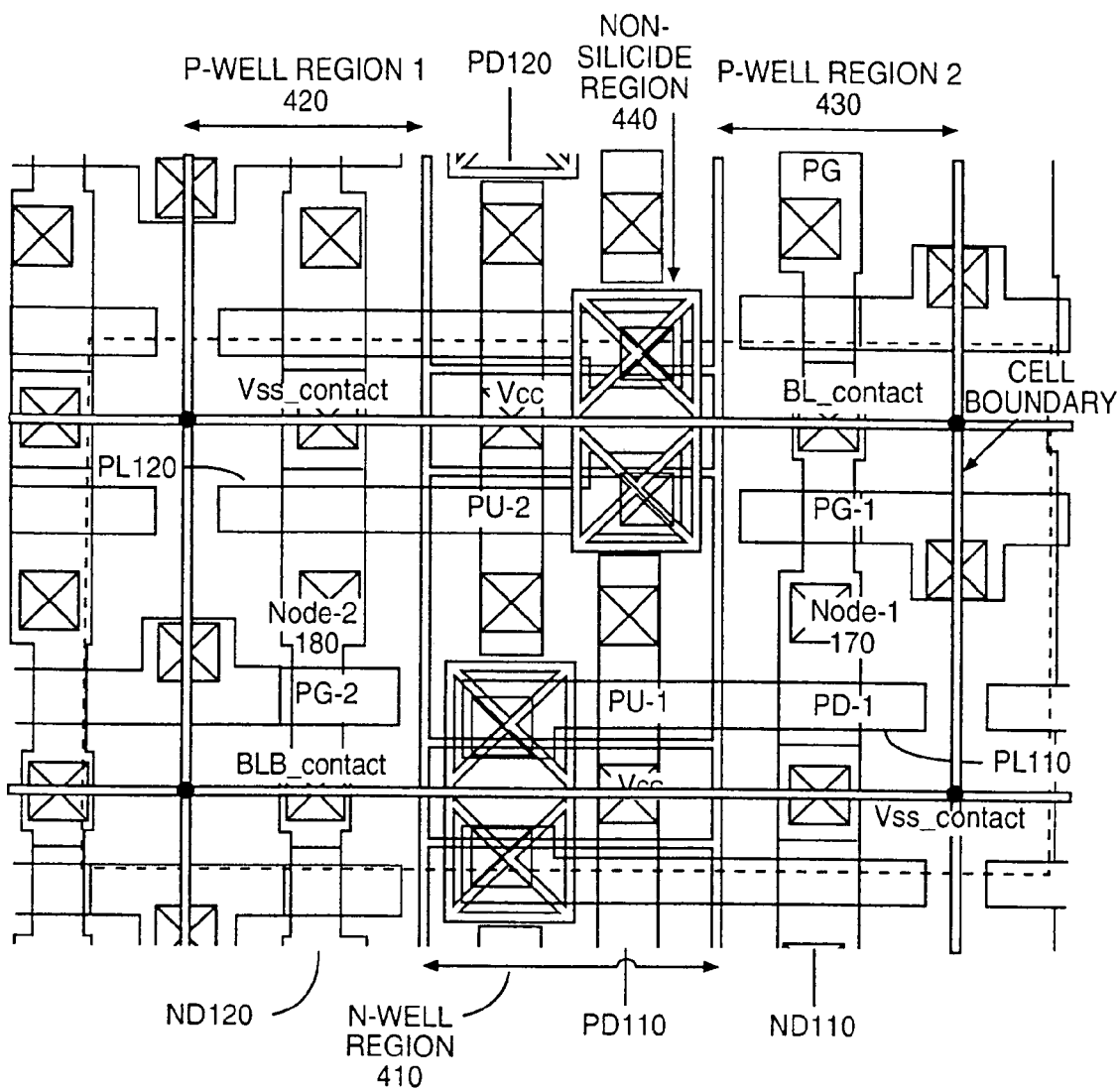
FIG. 4 is an exemplary layout diagram of a high resistor SRAM memory cell corresponding to the equivalent circuit shown in FIG. 2, according to an embodiment of the present invention.

FIGS. 4-7 are exemplary layout diagrams of a high resistor SRAM memory cell corresponding to the equivalent circuit shown in FIG. 2. As shown in FIG. 4, a high resistor SRAM memory cell is formed on an N-type well region N_Well and a P-type well region formed on a semiconductor substrate. Further, PMOS transistors PU-1 110 and PU-2 130 shown in the equivalent circuit in FIG. 2 are formed in the same N-type well region N_Well 410, and NMOS transistors PD-1 120 and PG-1 150 are formed in one P-well region 420, and NMOS transistors PD-2 140 and PG-2 160 are formed in another P-well region 430.

Transistor PU-1 110 includes a source region and a drain region, which are P+ diffusion regions PD110 formed by injection of P-type impurity respectively, and a gate region formed between the P+ diffusion regions and a polysilicon wiring layer PL110. Similarly, PU-2 130 includes a source region and a drain region, which are P+ diffusion regions PD120 formed by injection of P-type impurity respectively, and a gate region formed between the P+ diffusion regions and a polysilicon wiring layer PL120.

Transistor PD-1 120 includes a source region and a drain region, which are N+ diffusion regions formed by injection of N-type impurity respectively, and a gate region formed between the N+ diffusion regions ND110 and a polysilicon wiring layer. Similarly, PD-2 140 includes a source region and a drain region, which are N+ diffusion regions ND120 formed by injection of N-type impurity respectively, and a gate region formed between the N+ diffusion regions and a polysilicon wiring layer.

The polysilicon wiring layer PL110 functions also as the wiring for connecting between the gate regions of the PMOS transistor PU-1 110 and NMOS transistor PD-1 120, and the polysilicon wiring layer PL120 also functions as the wiring for connecting between the gate regions of the PMOS transistor PU-2 130 and NMOS transistor PD-2 140.

By preparing a non-silicide poly-1 region 440 a high resistor is created on PMOS side of the CMOS gate structure. A mask is used to create/define the high resistor region. Further detail of the high resistor preparation is described in FIGS. 6-7.

Figure 5:
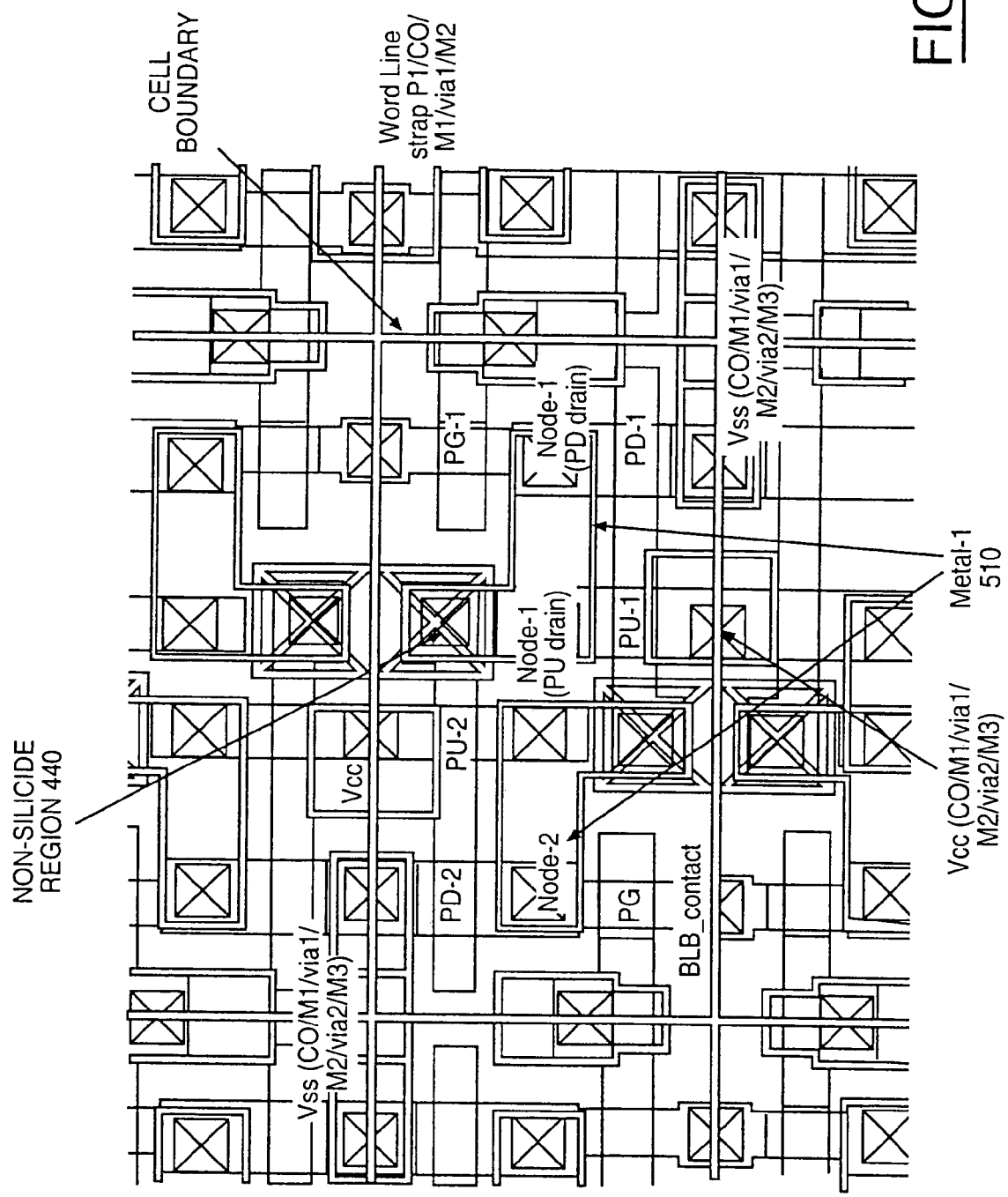
FIG. 5 is an exemplary node connection diagram of a high resistor CMOS gate, according to an embodiment of the present invention.

FIG. 5 illustrates node connections of a high resistor CMOS gate, according to one embodiment. At least one or more contact holes are formed each in the P+ diffusion regions PD110 and PD120, N+ diffusion regions ND110 and ND120, and polysilicon wiring layers PL110, PL120. In order to realize the connection and composition of the equivalent circuit shown in FIG. 2, these contact holes are mutually connected through metal or other upper wiring layers.

Various structures may be considered for upper wiring layers for connecting the contact holes. In one embodiment, the P+ diffusion region, N+ diffusion region, and polysilicon wiring layer PL120 are electrically connected through the upper wiring layer to compose node N-2 180, and the P+ diffusion region PD110, N+ diffusion region ND110, and polysilicon wiring layer PL110 are electrically connected through the upper wiring layer to compose node N-1 170.

The P+ diffusion region PD110 is connected to the $V_{CC}$ 105 line, which is a power source line, through the contact hole and upper wiring layer, and the N+ diffusion region ND120 is connected to the $V_{SS}$ 107 line, which is a grounding line, through the contact hole and upper wiring layer.

The N+ diffusion regions ND110 and ND120 are electrically connected to the positive phase bit line BL 102 and negative phase bit line BLB 101, respectively, through the contact hole and upper wiring layer.

The connection sequence for the high resistor is: CO (as a window of storage node (CMOS drain portion (silicon junction)) to Metal-1 510) and Metal-1 510 (connect both drain of PD-1 120 and PU-1 110 and another CMOS gate) and Contact (as a window of Metal-1 510 to CMOS gate) and high resistor portion of CMOS gate and silicide_P (CMOS gate—PMOS portion (capacitor PU-1 or 2)) and silicide_N (CMOS gate—NMOS portion (capacitor PD-1 or 2)).

Figure 6:
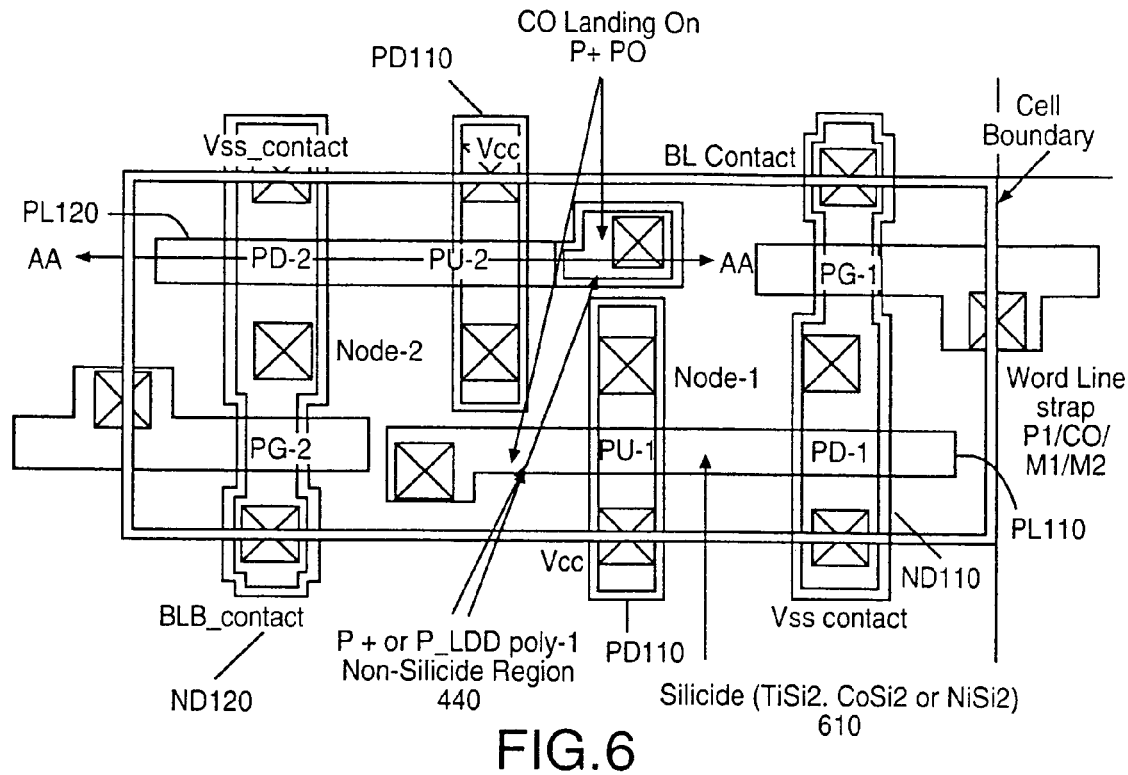
FIG. 6 illustrates a high resistor gate structure, according to one embodiment.

FIG. 6 illustrates a high resistor gate structure, according to one embodiment. The non-silicide poly-1 area is defined by resist protecting oxide ("RPO") MASK (definition of salicide protection) to prevent or substantially reduce salicide formation and is located on PMOS portion 440. The silicide portion of CMOS-1 gate structure 610 includes NMOS region and a selective PMOS portion. The resistance of non-silicide area is controlled by Boron concentration of P type poly. Two types of poly resistor doping processes are contemplated. In the first, a non-silicide poly-1 with both P_LDD and P+ S/D implant material is used. In the second, a non-silicide poly-1 with only P_LDD implant is used. The MASK flow and logic operation for the second type is "P+ S/D IMP MASK=(((P+ S/D layout) NOT (RPO)) OR ((P+ S/D layout) NOT (SRAM array dummy layout)))".

Figure 7:
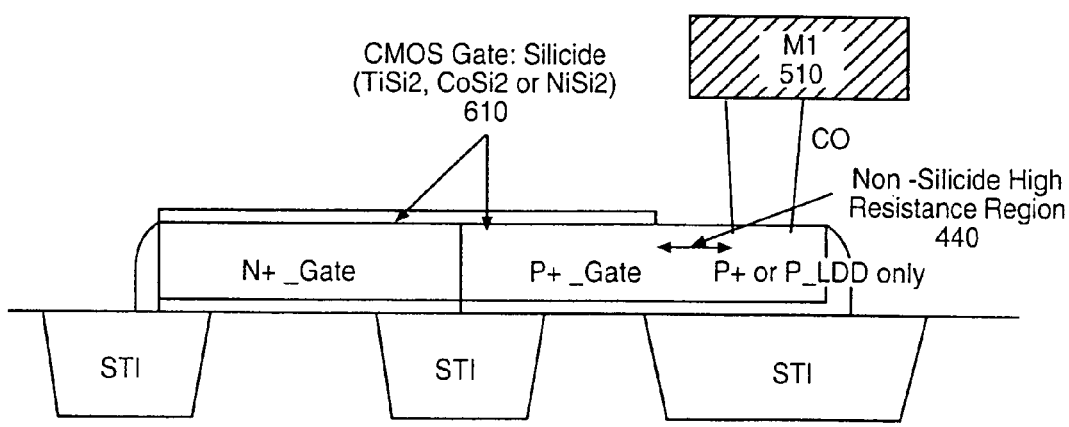
FIG. 7 illustrates a cross section AA-AA of the high resistor CMOS gate structure shown in FIG. 6, according to one embodiment.

FIG. 7 illustrates a cross section AA-AA of the high resistor CMOS gate structure shown in FIG. 6. The CMOS gate structure of CMOS-2 includes a NMOS portion and a PMOS portion. The NMOS portion of the gate is coated with silicide ($TiSi_2$, $CoSi_2$ or $NiSi_2$). A selective portion of the PMOS portion of the gate is coated with the silicide, whereas the remaining portion of the PMOS gate is substantially void of the silicide coating (also referred to as the non-silicide region 440). The non-silicide P+ region 440 on the PMOS gate creates the high resistor. A contact connects the high resistor to Metal-1 510.

Figures 8, 9:
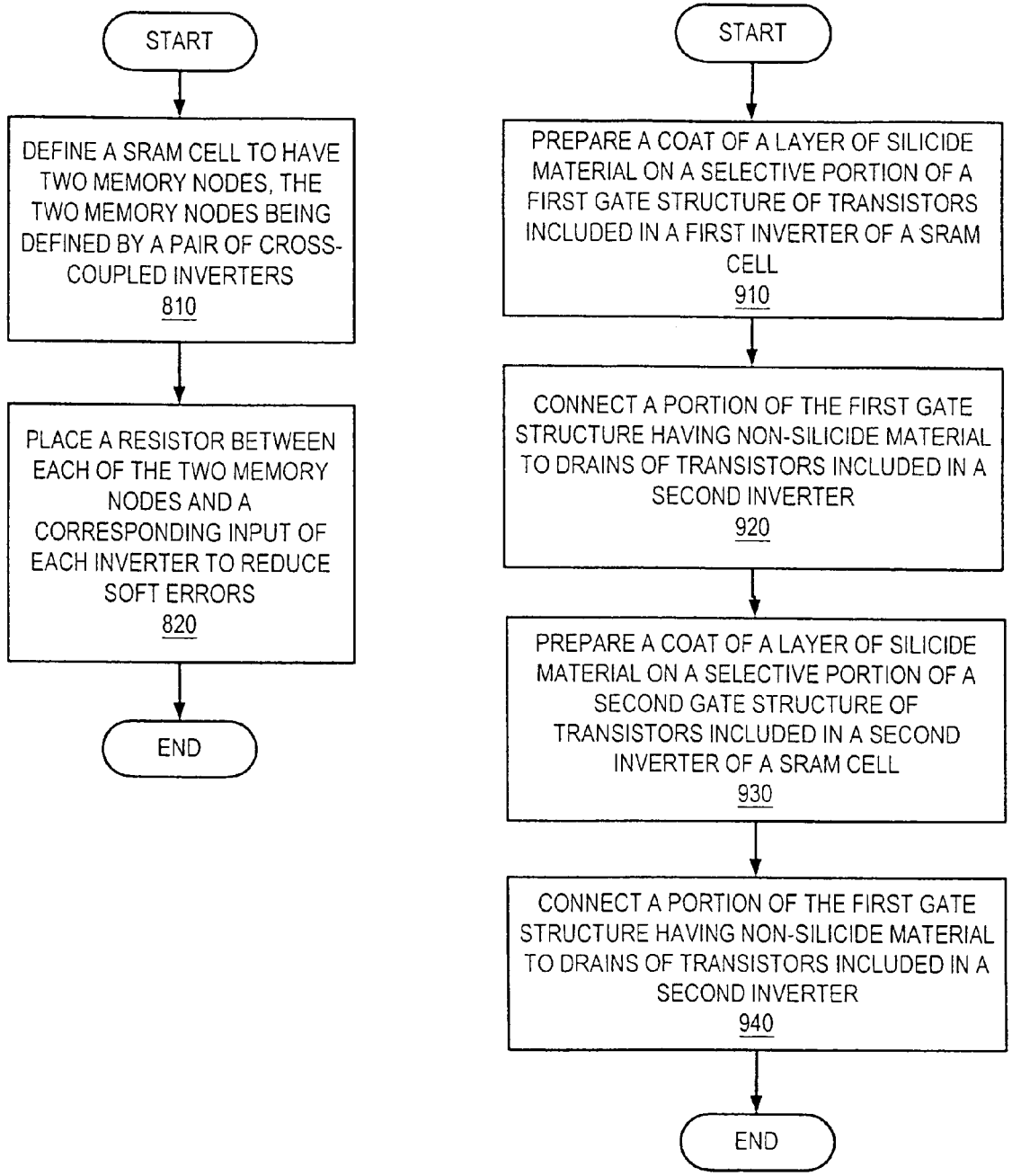
FIG. 8 is an exemplary flow chart illustrating a method for reducing soft errors of a SRAM cell, according to one embodiment.
FIG. 9 is an exemplary flow chart illustrating a method for fabricating a high resistor SRAM cell, according to one embodiment.

FIG. 8 is one embodiment of a flow chart illustrating a method for reducing soft errors of a SRAM cell. In step 810, a SRAM cell is defined to have two memory nodes, the two memory nodes being defined by a pair of cross-coupled inverters. In step 820, a resistor is placed between each of the two memory nodes and a corresponding input of each inverter to reduce the soft errors. The soft errors are reduced by increasing a discharge time for a charge stored on one of the memory nodes.

FIG. 9 is one embodiment of a flow chart illustrating a method for fabricating the high resistor SRAM cell 200. In step 910, cell 200 is fabricated by preparing a coat of a layer of silicide material on a selective portion of a first gate structure of a first and second MOS transistors included in a first inverter of the SRAM cell. In step 920, the portion of the first gate structure that is substantially void of the silicide material 440 is connected to a drain of PU-2 130 transistor and a drain of PD-2 140 transistor included in the second inverter 125.

Various steps of FIGS. 8 and 9 may be added, omitted, combined, altered, or performed in different orders. For example, in one embodiment, another set of steps 930 and 940, which add a second resistor gate may be included in FIG. 9. In step 930, a coat of a layer of silicide material is prepared on a selective portion of a second gate structure of PU-2 130 and PD-2 140 transistors. In step 940, a portion of the second gate structure that is substantially void of the silicide material 440 is connected to a drain of PU-1 110 transistor and a drain of PU-2 120 transistor.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of fabricating an SRAM cell having pair of cross-coupled inverters, the method comprising:
    preparing a coat of layer of silicide material on a selective portion of a first gate structure of a first and second MOS transistors included in a first inverter, wherein the selective portion of the first gate structure includes a gate of the second MOS transistor and a selective portion of a gate of the first MOS transistor;
    preparing a coat of a layer of silicide material on a selective portion of a second gate structure of the third and fourth MOS transistors, wherein the selective portion of the second gate structure includes a gate of the fourth MOS transistor and a selective portion of a gate of the third MOS transistor;
    connecting a remaining portion of the gate of the first MOS transistor that is substantially void of the silicide material to a drain of a third MOS transistor and a drain of a fourth MOS transistor included in a second inverter, wherein the remaining portion that is substantially void of the silicide material is disposed above a shallow trench isolation (STI) region near an edge of the gate of the first MOS transistor; and
    connecting a portion of the gate of the third MOS transistor that is substantially void of the silicide material to a drain of the first MOS transistor and drain of the second MOS transistor, wherein the remaining portion of the gate of the third MOS transistor that is substantially void of the silicide material is disposed above a shallow trench isolation (STI) region near an edge of the gate of the third MOS transistor.

2. The method of claim 1, wherein the portion of the first gate structure that is substantially void of the silicide material defines a first resistor.

3. The method of claim 1, wherein the portion of the second gate structure that is substantially void of the silicide material defines a second resistor.

4. The method of claim 1, wherein the first and third MOS transistors are of a first conductive type, and the second and fourth MOS transistors are of a second conductive type that is different from the first conductive type.

5. The method of claim 2, wherein the first resistor is prepared from a P+ or P.sub.—LDD doped polysilicon material.

6. The method of claim 2, wherein the first resistor is formed by a P+ and P.sub.—LDD doped polysilicon material.

7. The method of claim 3, wherein the second resistor is prepared from a P+ or P.sub.—LDD doped polysilicon material.

8. The method of claim 3, wherein the second resistor is formed by a P+ and P.sub.—LDD doped polysilicon material.

* * * * *